United States Patent [19]
Lustig et al.

[11] Patent Number: 6,020,264
[45] Date of Patent: Feb. 1, 2000

[54] METHOD AND APPARATUS FOR IN-LINE OXIDE THICKNESS DETERMINATION IN CHEMICAL-MECHANICAL POLISHING

[75] Inventors: Naftali Eliahu Lustig, Croton On Hudson, N.Y.; William L. Guthrie, Saratoga, Calif.; Thomas E. Sandwick, Hopewell Junction, N.Y.

[73] Assignee: International Business Machines Corporation, Armonk, N.Y.

[21] Appl. No.: 08/792,082

[22] Filed: Jan. 31, 1997

[51] Int. Cl.[7] .................................................. C23F 1/00
[52] U.S. Cl. ......................... 438/692; 156/345; 324/671
[58] Field of Search ........................... 156/345; 324/671; 438/692

[56] References Cited

U.S. PATENT DOCUMENTS

| | | | |
|---|---|---|---|
| 5,081,421 | 1/1992 | Miller et al. | 324/671 |
| 5,140,274 | 8/1992 | Wertz et al. | 324/671 |
| 5,213,655 | 5/1993 | Leach et al. | 156/627 |
| 5,240,552 | 8/1993 | Yu et al. | 156/636 |
| 5,242,524 | 9/1993 | Leach et al. | 156/345 |
| 5,309,110 | 5/1994 | O'Neill et al. | 324/674 |
| 5,337,015 | 8/1994 | Lustig et al. | 324/671 |
| 5,399,234 | 3/1995 | Yu et al. | 156/636 |
| 5,439,551 | 8/1995 | Meikle et al. | 437/225 |
| 5,461,007 | 10/1995 | Kobayashi | 437/225 |
| 5,492,594 | 2/1996 | Burke et al. | 216/86 |
| 5,640,242 | 6/1997 | O'Boyle et al. | |

OTHER PUBLICATIONS

Patent Application Y09–96–013, filed Jan. 31, 1996, Serial No. 08/594,925.

*Primary Examiner*—Robert Dawson
*Assistant Examiner*—Mark W. Milstead
*Attorney, Agent, or Firm*—Susan M. Murray

[57] ABSTRACT

In-line thickness measurement of a dielectric film layer on a surface of a workpiece subsequent to a polishing on a chemical-mechanical polishing machine in a polishing slurry is disclosed. The workpiece includes a given level of back-end-of-line (BEOL) structure including junctions. The measurement apparatus includes a platen and an electrode embedded within the platen. A positioning mechanism positions the workpiece above the electrode with the dielectric layer facing in a direction of the electrode. A slurry dam is used for maintaining a prescribed level of a conductive polishing slurry above the electrode, the prescribed level to ensure a desired slurry coverage of the workpiece. A capacitance sensor senses a system capacitance C in accordance with an RC equivalent circuit model, wherein the RC equivalent circuit includes a resistance R representative of the slurry and workpiece resistances and the system capacitance C representative of the dielectric material and junction capacitances. Lastly, a capacitance-to-thickness converter converts the sensed capacitance to a dielectric thickness in accordance with a prescribed system capacitance/optical thickness calibration, wherein the prescribed calibration corresponds to the given level of BEOL structure of the workpiece.

22 Claims, 8 Drawing Sheets

METHOD AND APPARATUS FOR IN-LINE OXIDE THICKNESS DETERMINATION IN CHEMICAL-MECHANICAL POLISHING

BACKGROUND OF THE INVENTION

1. Field of the Invention

This invention relates generally to chemical mechanical planarization or polishing tools and, more particularly, to a method and apparatus of in-line oxide thickness determination subsequent to chemical mechanical polishing of a semiconductor wafer.

2. Discussion of the Related Art

In semiconductor device manufacturing of very large scale integrated (VLSI) circuits, extremely small electronic devices are formed in separate dies on a thin, flat semiconductor wafer. In general, various materials which are either conductive, insulating, or semiconducting are utilized in the fabrication of integrated circuitry on semiconductor wafers. These materials are patterned, doped with impurities, or deposited in layers by various processes to form integrated circuits. VLSI integrated circuits include patterned metal layers which are generally covered with dielectric materials, such as oxide, followed by a subsequent metalization, etc. The semiconductor wafers thus contain metalization layers and interlevel dielectrics.

Increasing circuitry miniaturization and a corresponding increase in density has resulted in a high degree of varying topography being created on an outer wafer surface during fabrication. It is often necessary to planarize a wafer surface having varying topography to provide a substantially flat planar surface. One such planarization process known in the art is chemical-mechanical polishing (CMP).

Chemical mechanical polishing or planarization has been widely used in the semiconductor industry for smoothing, polishing or planarizing coating or layers on the surface of semiconductor wafers. This process has been used to achieve the planarization, the controlled reduction in thickness, or even the complete removal of such layers which may include, for example, an oxide on the surface of the semiconductor wafer. Apparatus for such chemical mechanical polishing process is well known and used in the semiconductor industry and is currently commercially available.

Briefly, the chemical mechanical polishing process requires that a workpiece be held, with the desired coated surface face down, on a polishing pad supported on a rotating table, in the presence of an abrasive slurry. A chemical mechanical polishing machine can include a single rotating polishing plate and a smaller diameter rotating wafer carrier to which a wafer (or wafers) is (are) mounted. The wafer carrier is held above the polishing plate, either in a stationary fixed position or oscillating back and forth in a predetermined path, while both polishing plate and wafer carrier are rotated about their respective center axes. A slurry, consisting of an abrasive suspension with or without an etching reagent, is fed onto the polishing plate during polishing of the wafer. The slurry, also referred to as a carrier liquid, can be selected to include an etchant for the coating being planarized and for not substantially attacking other materials involved in the process. The slurry is further fed between the polishing plates to polish and flush away the material removed from the semiconductor wafer.

Referring now briefly to FIG. 1, an example of the formation of a dielectric 10 is shown above two devices in the fabrication of a high performance VLSI circuit 12. The dashed line is representative of the non-planar topology of the dielectric material 10 subsequent to its formation and/or deposition upon the surface of the wafer 14. Bumps 16 are noted in the top surface 18 of the dielectric layer 10, layer 10 having, for example, a nominal thickness on the order of 10,500 Å as indicated by arrow 20. The dielectric layer 10 is planarized to a desired level 22 above the devices, layer 10 then having a desired nominal thickness on the order of 6,500±500 Å, as indicated by arrow 24. Planarization may be achieved upon polishing back, using CMP, to the level 22 as shown by the solid line. FIG. 2, is representative of an example of a subsequent manufacturing step using the substrate of FIG. 1, including a local interconnect metalization M0 in the first dielectric layer 10, an intermediate dielectric layer 30 having vias 32 formed therein, and a first interconnect metalization layer M1. A dielectric layer 34 is formed upon the first metalization layer M1, wherein the dashed line is representative of the non-planar topology of the dielectric material above the first metalization layer M1. Bumps 36 are noted in the top surface 38 of the dielectric layer 34, layer 34 having, for example, a nominal thickness on the order of 20,500 Å as indicated by arrow 40. The dielectric layer 34 may then be planarized using CMP to a desired level 42 above the top of the first metalization layer M1, layer 34 then having a desired nominal thickness on the order of 9,000±500 Å, as indicated by arrow 44.

A persistent difficulty in the fabrication of VLSI wafers is the inability to determine when a required thickness or endpoint has been reached during a dielectric polishing step. one method of determining the required thickness or CMP endpoint is by using estimated CMP rates and times. CMP rates vary considerably with time however, due to changes in polishing pad characteristics, for example. Frequent stops are required in the fabrication process for ex-situ optical thickness measurements. With ex-situ thickness measurements, the method is extremely time consuming and highly undesirable since operators must handle, unload, and dry each wafer after polish before making the ex-situ thickness measurement. Process throughput is thereby reduced and product yields are lowered. A more precise CMP endpoint detection method and apparatus is desired.

It would be desirable to provide a solution to the problem of how to accurately determine a thickness of an interlevel dielectric remaining above a patterned VLSI wafer, post chem-mech planarization, without an undesirable extra handling, unloading and drying of the wafer. Furthermore, a thickness determination method and apparatus which makes use of low voltage operation and is compatible for use in the VLSI fabrication of low voltage (i.e., less than one-half volt) silicon junction devices is also desired. In addition, there remains a continuing need in the semiconductor fabrication art for an apparatus and method for accurately and efficiently detecting and monitoring dielectric thickness during a polishing sequence of a chemical-mechanical planarization process.

SUMMARY OF THE INVENTION

It is an object of the present invention to overcome the problems identified in the art.

In accordance with the present invention, an apparatus for in-line thickness measurement of a dielectric film layer on a surface of a workpiece subsequent to a polishing of the dielectric film layer on a chemical-mechanical polishing machine in a polishing slurry includes the following, wherein the workpiece is characterized as having a given level of back-end-of-line (BEOL) structure including junctions. The apparatus includes a measurement platen and a measurement electrode embedded within the measurement platen. A positioning means is provided for positioning the workpiece above the measurement electrode with the dielectric layer facing in a direction of the measurement electrode. A slurry level maintaining means is provide for maintaining a prescribed level of a conductive polishing slurry above the measurement electrode, the prescribed level to ensure a desired slurry coverage of the workpiece. The slurry maintains a static electrical contact with the dielectric layer and the workpiece. A capacitive sensing means is provided for sensing a system capacitance C in accordance with an RC equivalent circuit model in which a resistance R is representative of the slurry and workpiece resistances and the system capacitance C is representative of the dielectric material and junction capacitances. Lastly, a capacitance-to-thickness means is provided for converting the sensed capacitance to a dielectric thickness in accordance with a prescribed system capacitance/optical thickness calibration. The prescribed calibration corresponds to the given level of BEOL structure of the workpiece.

In accordance with an alternate embodiment of the present invention, a method for in-line thickness measurement of a dielectric film layer on a surface of a workpiece subsequent to a polishing of the dielectric film layer on a chemical-mechanical polishing machine in a polishing slurry includes the following steps, wherein the workpiece is characterized as having a given level of back-end-of-line (BEOL) structure including junctions. The steps include providing a measurement platen and a measurement electrode embedded within the measurement platen. The workpiece is positioned above the measurement electrode with the dielectric layer facing in a direction of the measurement electrode. A prescribed level of the polishing slurry is maintained above the measurement electrode, the prescribed level to ensure a desired slurry coverage of the workpiece, wherein the slurry maintains a static electrical contact with the dielectric layer and the workpiece. A system capacitance C is then sensed in accordance with an RC equivalent circuit model in which a resistance R is representative of the slurry and workpiece resistances and the system capacitance C is representative of the dielectric material and junction capacitances. Lastly, the sensed capacitance is converted to a dielectric thickness in accordance with a prescribed system capacitance/optical thickness calibration, wherein the prescribed calibration corresponds to the given level of BEOL structure of the workpiece.

In accordance with yet another alternate embodiment of the present invention, a chemical-mechanical polishing system includes a chemical-mechanical polishing means for chemical-mechanical polishing of a dielectric layer on a surface of a workpiece in a polishing slurry, wherein the workpiece is characterized as having a given level of back-end-of-line (BEOL) structure including junctions. An in-line dielectric thickness measurement means, separate from the chemical-mechanical polishing means, provides a means for measuring an in-line thickness measurement of the dielectric film layer subsequent to a prescribed polishing of the dielectric layer of the workpiece by the chemical-mechanical polishing means. The in-line thickness measurement means further provides a thickness measurement output signal. A positioning means is provided for positioning the workpiece between the chemical-mechanical polishing means and the in-line thickness measurement means. Lastly, a control means is provided for controlling a polishing sequence of the workpiece by the chemical-mechanical polishing means in response to the thickness measurement output signal.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

Figure 3:
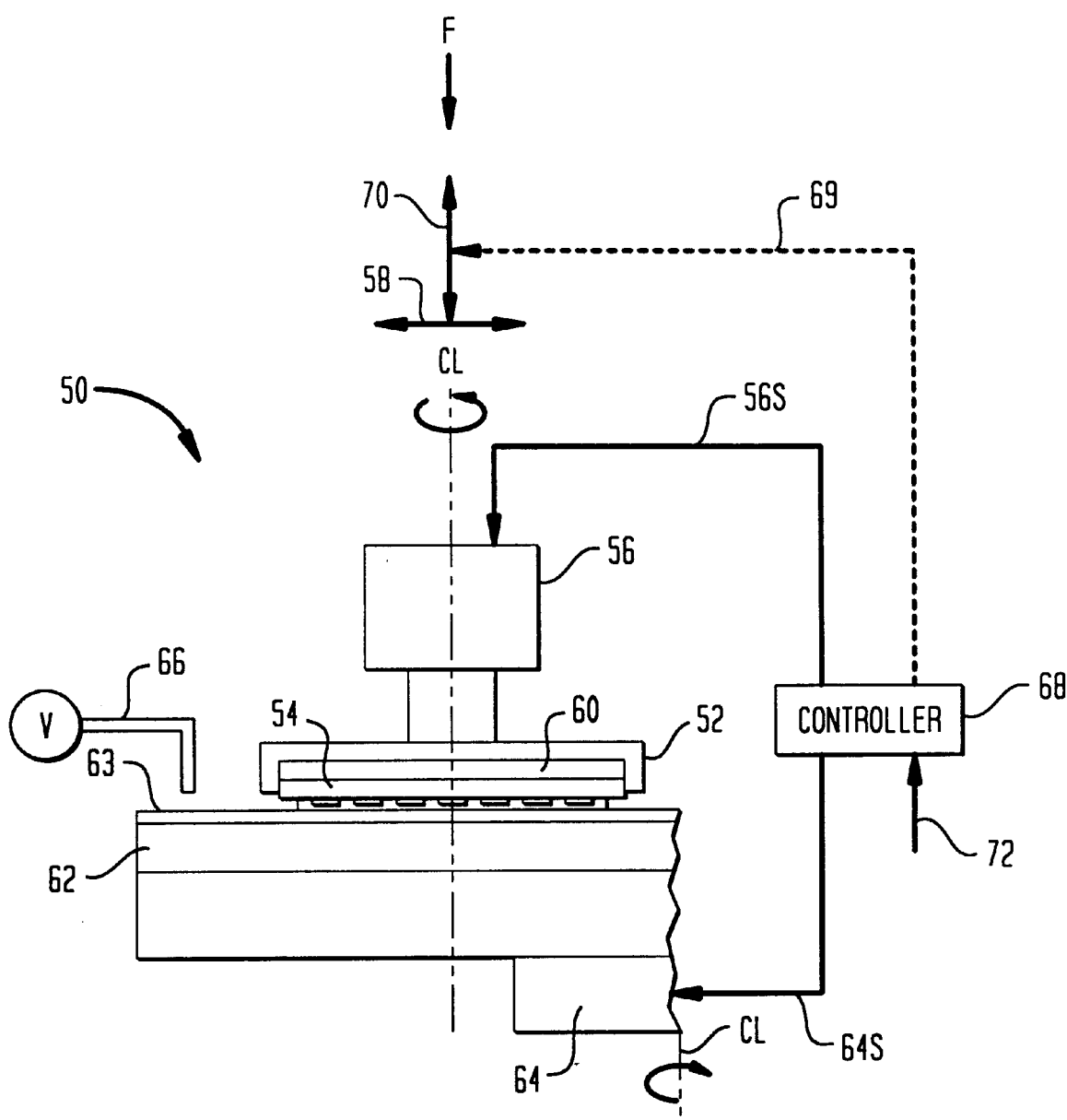
FIG. 3 is a schematic view of a chemical mechanical planarization (CMP) apparatus for use in accordance with the method and apparatus of the present invention.

Referring now to FIG. 3, an apparatus suitable for performing a chemical mechanical planarization (CMP) process in accordance with the present invention is shown and generally designated by numeral 50. The chemical mechanical planarization apparatus 50 includes a wafer carrier 52 for holding a semiconductor wafer 54. The wafer carrier 52 is mounted for rotation as desired by a drive motor 56. In addition, the wafer carrier 52 is mounted for transverse movement as desired, further as indicated by the double headed arrow 58. The wafer carrier 52 may also include a wafer carrier pad 60 formed of a soft material for contacting a backside of the wafer 54. Additionally, wafer carrier 52 may further include a vacuum holding means (not shown) for holding the wafer 54 in the wafer carrier 52 during the chemical mechanical planarization process. The wafer carrier 52 is still further adapted for exerting a downward force F upon the wafer 54. The CMP apparatus 50 further includes a polishing platen 62 mounted for rotation by a drive motor 64. A polishing pad 66 formed of a suitable material, such as blown polyurethane, is mounted to the polishing platen 62. The polishing platen 62 is relatively large in comparison to the wafer 54 so that during the CMP process, the wafer 54 may be moved according to a desired movement across the surface of the polishing pad 64 by the wafer carrier 52. A polishing slurry containing an abrasive fluid, such as silica or alumina abrasive particles suspended in either a basic or an acidic solution, is deposited through a conduit 66 onto the surface of the polishing pad 64.

Referring still to FIG. 3, a controller 68 provides signals via signal lines 56s, 64s to the wafer carrier drive motor 56 and the platen drive motor 64, respectively, for an appropriate control of the same during a polishing operation, further in accordance with a desired operation and/or planarization sequence. Controller 68 may further include an output control signal for controlling a mechanical arm or other suitable mechanical device (illustrated by the dashed line 69) for performing an intended positioning and/or movement of wafer carrier 52, such as raising and/or lowering the wafer carrier 52 above platen 62 as shown by arrow 70. Other mechanical placements of the wafer carrier 52 can also be controlled as appropriate by controller 68. Controller 68 can further include an input 72, representative, for example, of a dielectric thickness measured in accordance with the measurement method and apparatus of the present invention, for controlling a CMP process sequence being carried out upon the CMP apparatus 50 for a particular back-end-of-line VLSI wafer structure. Controller 68 preferably includes any suitable programmable controller device, such as a computer, for performing the intended operations and functions as described herein. Programmable controller devices, computers, associated interface circuitry, and the programming of the same is known in the art and not further discussed herein.

Figure 1:
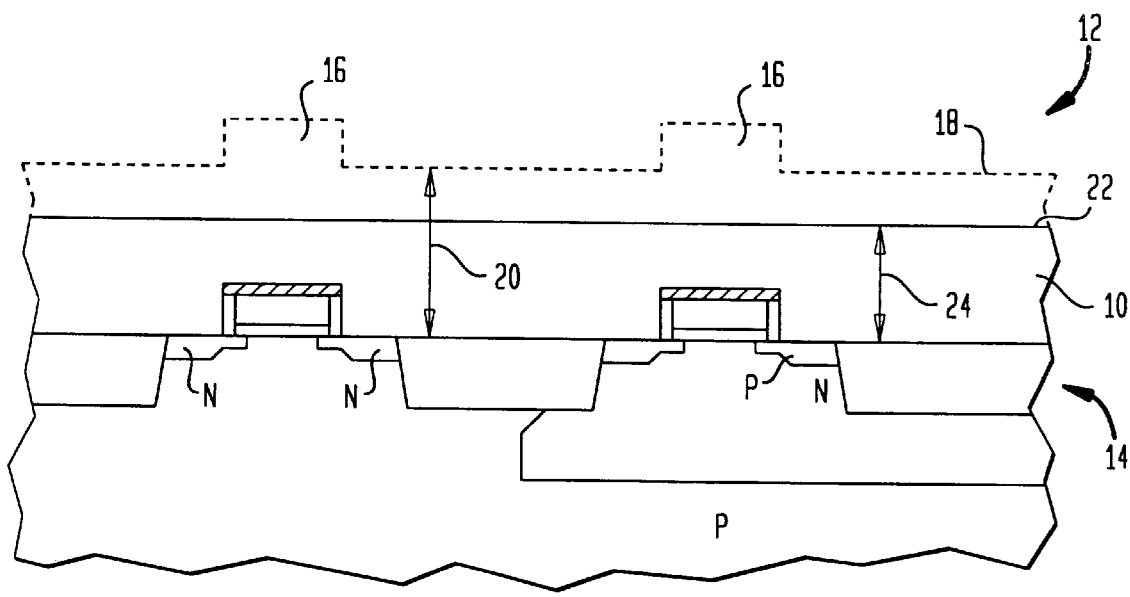
FIG. 1 shows an example of the formation of a dielectric layer above two devices in the fabrication of a portion of a high performance VLSI circuit.
Figure 2:
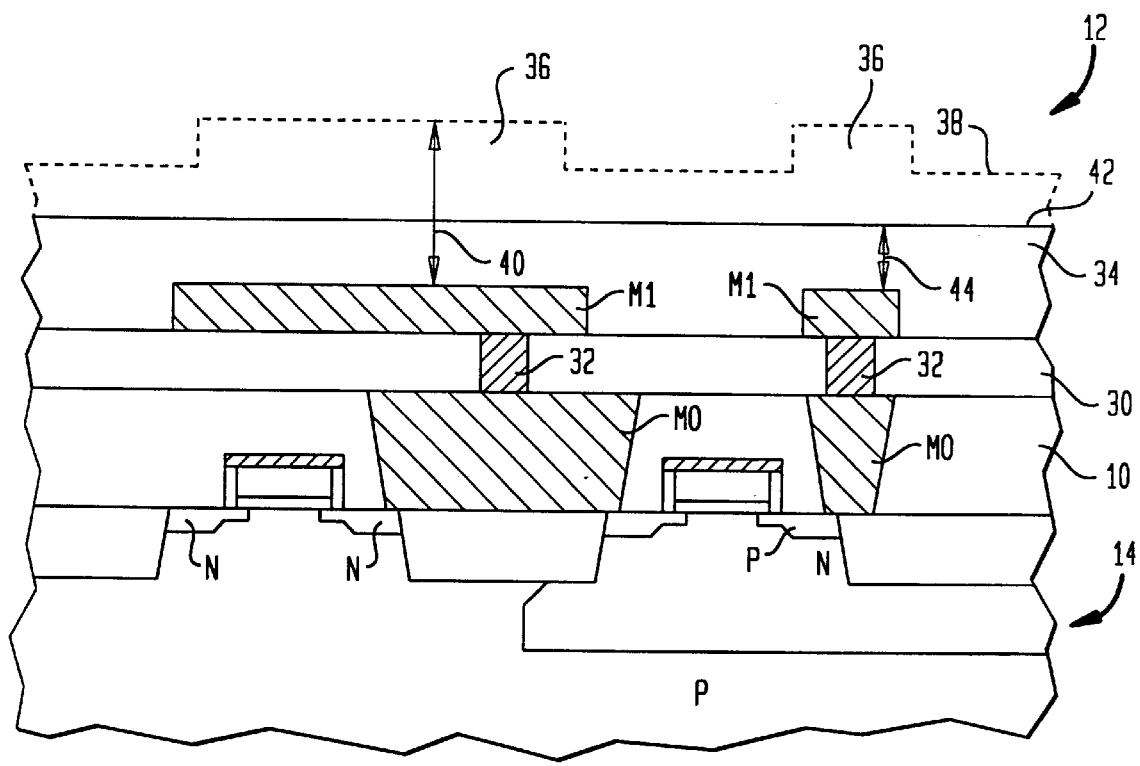
FIG. 2 shows an example of the formation of a dielectric layer in a subsequent fabrication step of the portion of the high performance VLSI circuit of FIG. 1.
Figure 4:
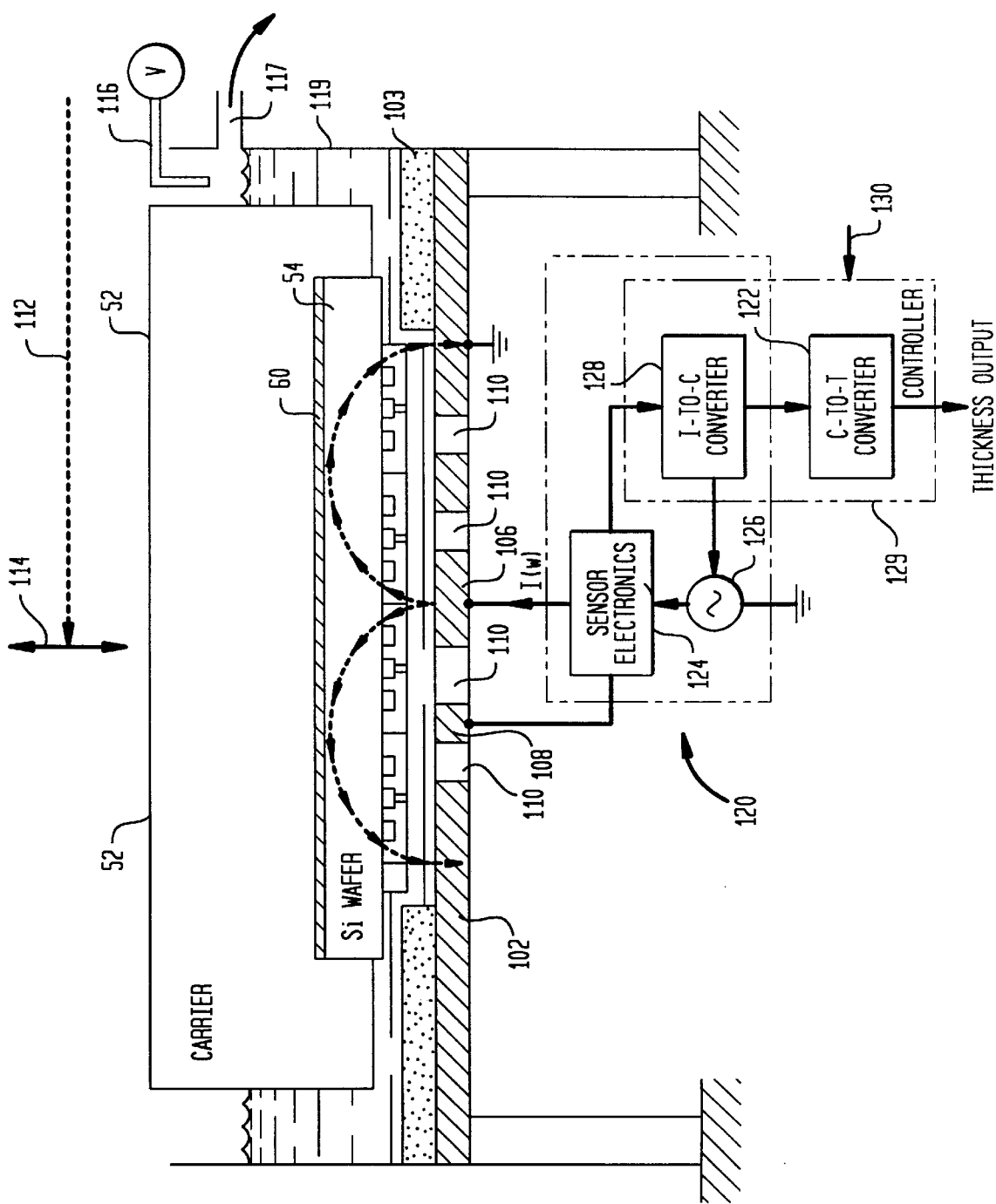
FIG. 4 is a schematic view of the in-line dielectric layer thickness measurement apparatus in accordance with the present invention and for use in carrying out the method in accordance with the present invention.

Turning now to FIG. 4, an apparatus 100 for in-line thickness measurement of a dielectric film layer on a surface of a workpiece subsequent to a polishing of the dielectric film layer on a chemical-mechanical polishing machine in a polishing slurry shall now be discussed. For purposes of this discussion, the following shall make reference to the workpiece or wafer structure as shown in FIG. 2, however, other configurations of the layers of a workpiece are also possible. For the wafer structure 12 (shown in FIG. 2), the structure can be characterized as having a given level of back-end-of-line (BEOL) structure including junctions, such as discussed herein above. Note that the structure of FIG. 1 contains a different level of back-end-of-line structure from that of FIG. 2.

Figure 5:
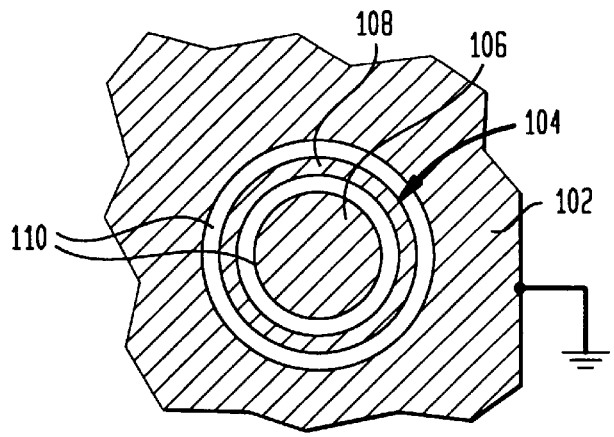
FIG. 5 is a top view of a measurement electrode embedded within the measurement platen in accordance with the present invention, the measurement electrode including a center electrode and a guard electrode.

In-line dielectric thickness measurement apparatus 100 of FIG. 4 includes a measurement platen 102 and a measurement electrode 104 embedded within the measurement platen. The measurement electrode 104 is shown in further detail with reference to FIG. 5. The measurement electrode includes a circular center electrode 106 and a circular ring guard electrode 108 surrounding and concentric with the center electrode 106. The center electrode 106 and the guard electrode 108 are electrically isolated from each other and from the measurement platen 102 by suitable insulative material 110.

Referring once again to FIG. 4, a positioning means 112 (illustrated by the dashed line) includes any suitable mechanical arm or mechanism for positioning the workpiece 54 above the measurement electrode 104 with the dielectric layer 34 facing in a direction of the measurement electrode 104. Positioning means 112 is connected to wafer carrier 52 for performing an intended positioning and/or movement of wafer carrier 52, such as raising and/or lowering the wafer carrier 52 above measurement electrode 104 as shown by arrow 114. Positioning means 112 may further be the same mechanism as the mechanical arm or other suitable mechanical device illustrated by the dashed line 69 in FIG. 3, for performing an intended positioning and/or movement of wafer carrier 52 between the CMP apparatus 50 of FIG. 3 and the in-line dielectric thickness measurement apparatus 100 of FIG. 4. This later positioning and/or movement of wafer carrier 52 between CMP apparatus 50 and in-line dielectric thickness measurement apparatus 100 may also be controlled as appropriate by controller 68 of FIG. 3, wherein preferably apparatus 50 and 100 are proximate one another.

Once again referring to FIG. 4, a means 116 is provided for maintaining a prescribed level of a conductive polishing slurry above the measurement electrode 104. The prescribed level is selected to ensure a desired slurry coverage of the workpiece 54 in conjunction with the measurement electrode 104. With the desired level of slurry in the measurement apparatus 100, the slurry thus maintains a static electrical contact between the measurement electrode 104 and the combination of the dielectric layer 34 and the workpiece 54 during a measurement operation. Any loss of slurry resulting from removal of the wafer 54 and wafer carrier 52 from the slurry bath will not adversely affect subsequent measurements, since the slurry level is regulated and replenished. The later lends itself to an improved reliability and repeatability of dielectric thickness measurements. There is thus maintained a constant and repeatable bath of slurry within the measurement apparatus 100. One manner of maintaining a constant level would be to insert a drainage conduit 117 in a wall 119 of the measurement apparatus 100 located at a certain height above the measurement platen 102, wherein filling of the measurement apparatus 100 with a continued flow of slurry until slurry begins flowing out the drainage conduit 117 will self regulate the slurry to the desired level. Other possible arrangements may be taken for maintaining a given level of slurry within the measurement apparatus in preparation for and/or during a measurement operation. Alternatively, a conduit (not shown) may connect between the CMP apparatus 50 and the in-line dielectric thickness measurement apparatus 100 for providing the same slurry to each respective apparatus.

In addition to the above discussion, the measurement sensor set-up further includes a pad 103 overlying platen 102 and having an opening in the proximity of the measurement sensor electrode 104. The effective measurement area of the thickness measurement apparatus 100 is on the order of three to five inches in diameter. In conjunction with the opening in pad 103 and the use of a slurry dam (i.e., the slurry dam is akin to the slurry bath provided by the maintaining of the slurry at a desired level) around the measurement sensor electrode 104, together, the opened pad and the slurry dam around the sensor improve a reproducibility of the measurement technique over prior known techniques for CMP oxide thickness measurement.

A system capacitance sensing means 120 is provided for sensing a system capacitance C in accordance with an RC equivalent circuit model. The RC equivalent circuit model, to be discussed further herein below, is one in which a resistance R is representative of the slurry and workpiece resistances and the system capacitance C is representative of the dielectric material and junction capacitances of the workpiece. The system capacitance sensing means 120 is connected at a guard input to the guard electrode 108 of the measurement electrode 104. The sensing means 120 is further connected at a center input to the center electrode 106 of the measurement electrode 104. In addition, system capacitance sensing means 120 provides a output signal representative of the sensed capacitance. Lastly, a capacitance-to-thickness converter means 122 is provided for converting the sensed capacitance as provided by the system capacitance sensing means 120 to a dielectric thickness in accordance with a prescribed system capacitance/optical thickness calibration. The prescribed calibration corresponds to the given level of BEOL structure of the workpiece 54.

Figure 6:
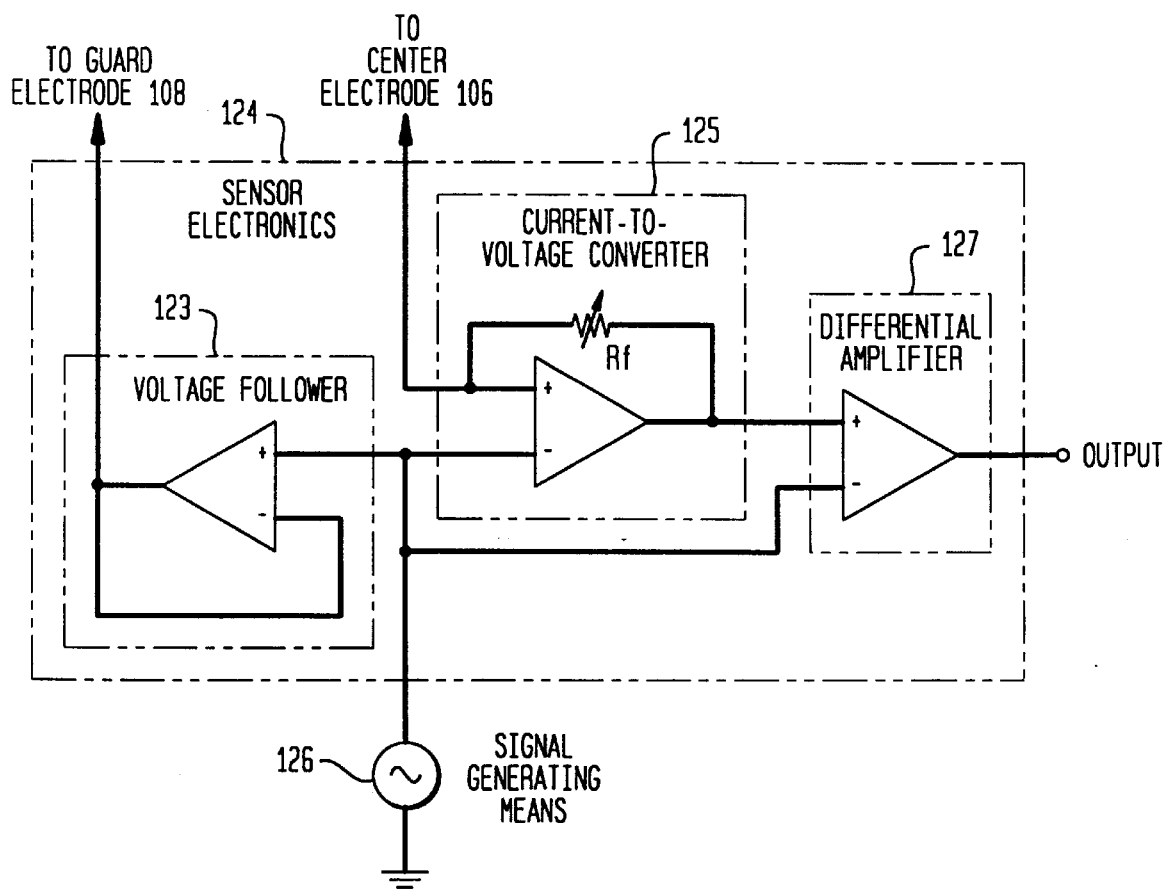
FIG. 6 shows an exemplary circuit for obtaining a voltage representative of an out-of-phase component of an alternating current flowing through the measurement system in accordance the present invention.

Referring now to FIGS. 4 and 6, capacitance sensing means 120 further includes (i) sensor electronics 124, that is, means for sensing an out-of-phase component of an alternating current flowing through the system at various preselected frequencies and constant applied voltage, (ii) a variable frequency alternating current (AC) voltage source or signal generating means 126 for providing the constant applied voltage at the various preselected frequencies, and (iii) current-to-capacitance converter means 128 for converting the sensed out-of-phase component of the AC current at the various frequencies into a system capacitance C in accordance with the RC equivalent circuit model.

In further detail, sensor electronics 124 includes a voltage follower 123 electrically coupled to an output of AC signal generating means 126. The output of the voltage follower 123 is electrically coupled to the guard electrode 108 of the measurement electrode 104. Voltage follower 123 prevents an undesired loading of signal generating means 126. Sensor electronics further includes a current-to-voltage converter 125 and a differential amplifier 127. The current-to-voltage converter 125 includes first and second inputs and an output. The non-inverted input of converter 125 is electrically coupled to the center electrode 106 of the measurement electrode 104. The inverting input of converter 125 is electrically coupled to the output of signal generating means 126. Current-to-voltage converter 125 converts a current I(ω) flowing through center electrode 106 into a voltage signal at its output during a measurement operation. The gain of the current-to-voltage converter 125 is controlled by the value of feedback resistance Rf connected between its non-inverted input and its output. A non-inverted input of differential amplifier 127 is electrically coupled to the output of the current-to-voltage converter 125. An inverted input of differential amplifier 127 is electrically coupled to the output of signal generating means 126. Differential amplifier 127 provides an output voltage representative of the current I(ω) flowing through center electrode 106. Differential amplifier 127 serves to subtract out that portion of the voltage signal contained in the output signal of the current-to-voltage converter 125 which is attributable to the signal of the signal generating means 126. Other implementations for the sensor electronics 124 may also be possible.

Variable frequency signal generating means 126 preferably includes a programmable (i.e., controllable) signal generating means for providing a desired frequency in response to an appropriate control signal. The various preselected frequencies include frequencies in the range of 1 to 50 kHz and the constant applied voltage includes a voltage of less than 0.5 volts.

At this point in our discussion, the method in accordance with the present invention for determining the thickness of an interlevel dielectric oxide layer shall now be discussed. As mentioned, the interlevel dielectric layer of interest is that dielectric layer remaining above a patterned VLSI wafer post chem-mech planarization. The procedure for determining the dielectric thickness is referred to herein as an in-line measurement, as opposed to an in-situ or ex-situ measurement. In-situ measurement generally refers to a measurement made during an actual polishing of the wafer on the CMP apparatus. Ex-situ measurement generally refers to a measurement made off-line which includes the unloading, handling, rinsing, and drying of the wafer prior to making an off-line measurement. As can be understood from the disclosure herein, the present invention provides an in-line dielectric layer thickness measurement without an undesirable extra unloading, handling, rinsing or drying of the wafer, during a manufacturing production run of a particular level of a particular type wafer having a certain BEOL structure.

The method in accordance with the present invention for determining the thickness of an interlevel oxide layer includes the following steps. The wafer is first polished for a predetermined amount of time on the CMP apparatus 50. Without unloading wafer 54 from the wafer carrier 52 and without rinsing and/or drying, the wafer 54 is placed over the measurement sensor electrode 104 of the in-line dielectric thickness measurement apparatus 100, wherein the measurement sensor electrode 104 is immersed in a slurry bath. The slurry bath of the measurement station 100 is preferably similar to the slurry used for the polishing of the wafer. Next, a low amplitude (<0.5 volts) AC voltage is applied to the wafer via the measurement electrode 104 and a resulting out-of-phase component of an AC current is measured. Application of the low amplitude AC voltage is repeated at a number of frequencies, preferably on the order of 10 times. The desired frequencies of the applied signal are selected to be in the range between 1 and 50 kHz, inclusive, and further wherein the applied signal has a same voltage amplitude at each frequency. Next, a mathematical fit is conducted on the resulting measured current values at the various frequencies to a circuit model (as will be discussed further herein below), the circuit model representative of the multilevel structure under polish. Upon obtaining the mathematical fit, a sensed capacitance (one of the fit parameters) is extracted using a suitable known least squares mathematical fitting algorithm or procedure. A resultant dielectric layer thickness is then obtained from the sensed capacitance determined in immediately previous step using a predetermined calibration curve of capacitance vs. optical thickness for the given VLSI structure and interconnect level. The capacitance vs. optical oxide thickness calibration procedure is discussed further herein below also.

As briefly discussed above, the method and apparatus according to the present invention provide for modeling of the structure under polish, a calibration procedure, and an inline dielectric thickness measurement and sensor set up. The combined multi-frequency technique and least squares fitting routine advantageously reduces an amount of error due to noise as is associated with a single in-situ measurement. The method and apparatus of the present invention further provide for an accuracy on the order of +/−500 Å. Still further, a means is provided for calibrating the electrical measurements.

Figure 7:
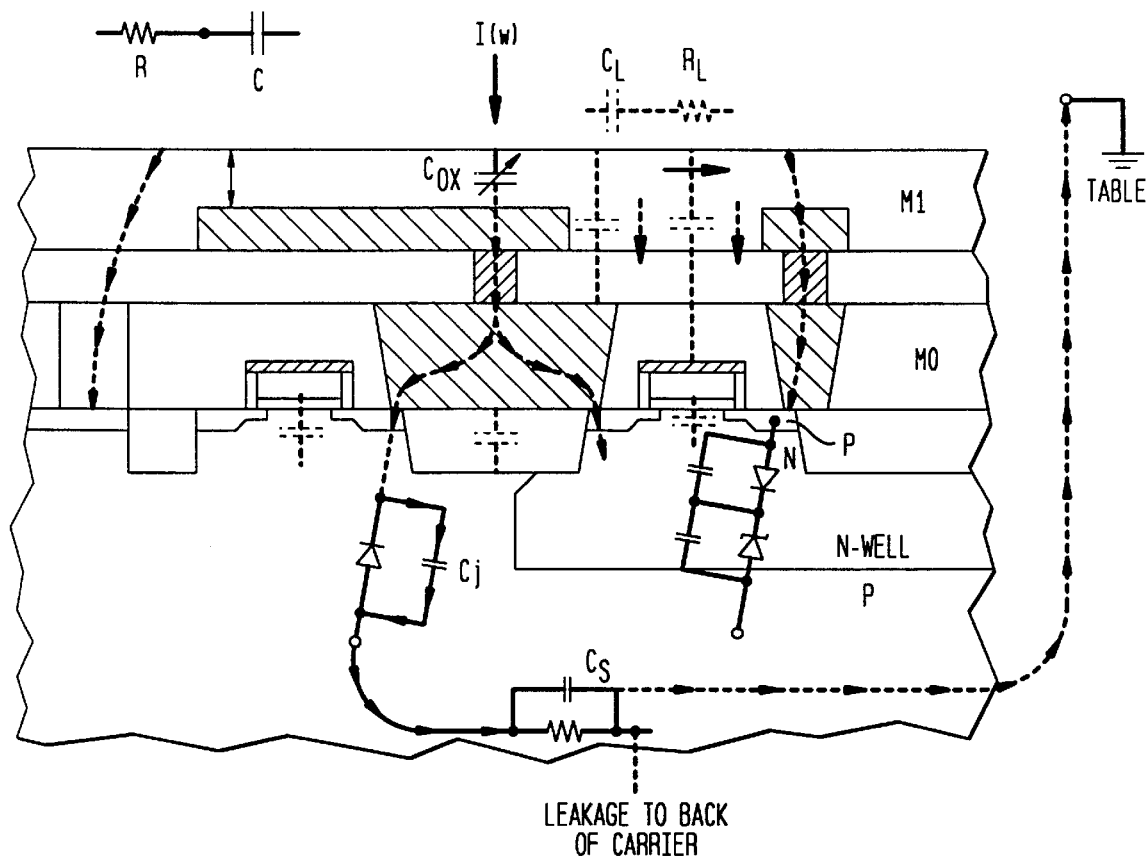
FIG. 7 is a schematic view showing current flow patterns in a portion of a semiconductor wafer in the partially formed VLSI circuit having various metalization and dielectric layers thereon, further with respect to an RC equivalent circuit modeling of the measurement system in accordance with the present invention.

With reference to FIG. 7, underlying principles for the capacitive sensor operation in accordance with the method and apparatus of the present invention include determining a thickness of the oxide under polish by measuring a capacitance of the system (in contrast to a capacitance measurement of a single layer). A second principle includes that for a given back-end-of-line (BEOL) level, the relationship between the oxide thickness and the capacitance of the system (system capacitance) needs to be determined, for the establishment of a calibration curve.

Figure 8:
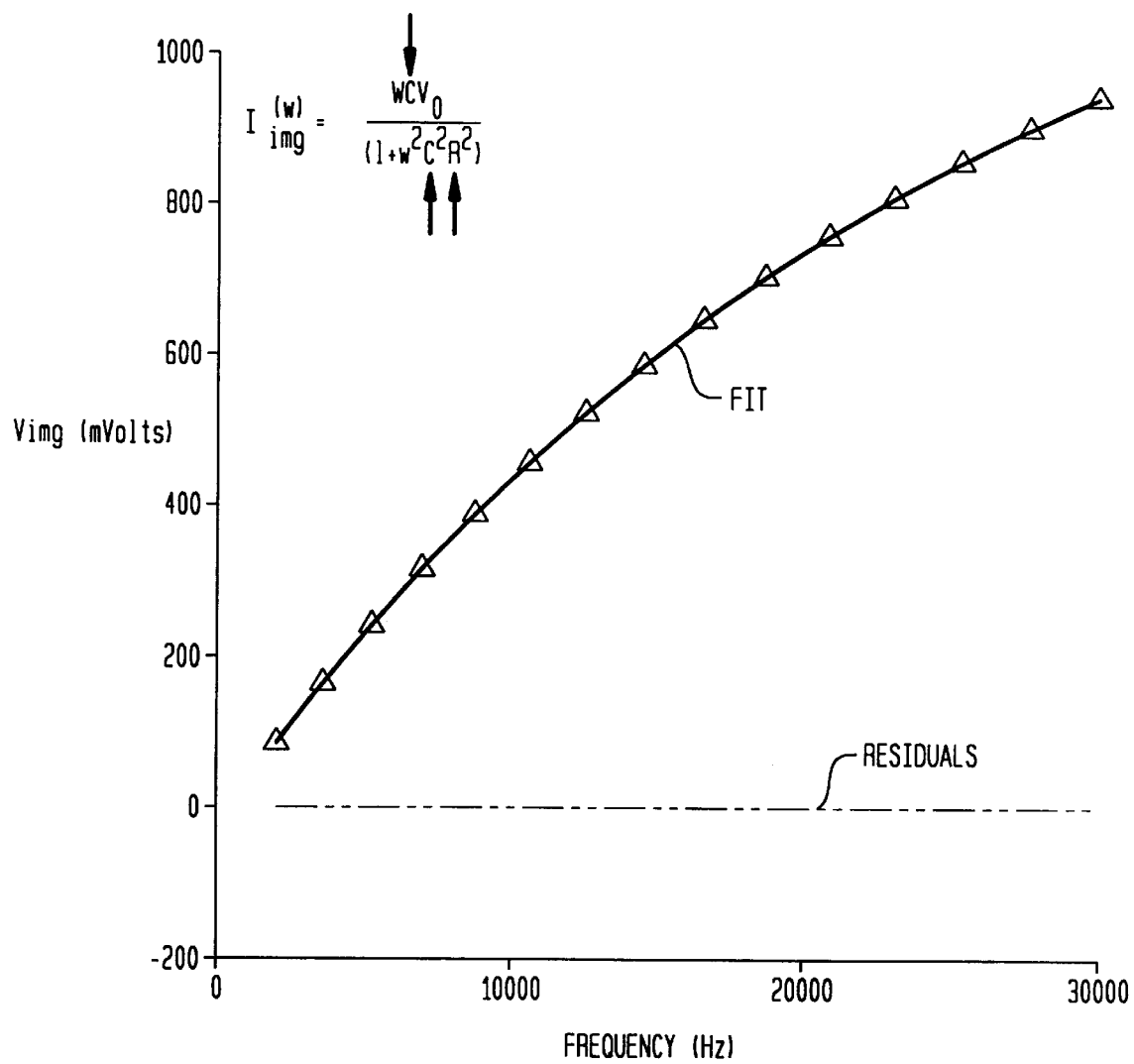
FIG. 8 is a graphical plot of a signal representative of an out-of-phase component of current as a function of an applied signal frequency, as used in conjunction with the determination of a capacitance of the system in accordance with the present invention.

With reference now to both FIGS. 7 and 8, the discussion to follow provides further details of the capacitance determination procedure used in accordance with the present invention. Such a capacitance determination begins with the measuring of the out-of-phase component (i.e., the imaginary component) of the current flowing through the system at various frequencies and at a constant applied voltage. The measurements are taken at frequencies in the range from 1 to 50 kHz at an applied voltage of less than 0.5 volts, preferably on the order of 400 mV. In a preferred embodiment, a simple resistor-capacitor RC equivalent circuit is used to model the system, where parameter R is representative of the slurry and wafer resistance. Parameter C is representative of the oxide and junction capacitances.

Next, values of R and C are determined using a two (2) parameter non-linear least squares (LS) fit (using any suitable LS fitting algorithm known in the art) to the out-of-phase component of the current as a function of applied signal frequency (FIG. 8). The out-of-phase current is given by the expression:

$$I_{imaginary} = \frac{\omega C V}{(1 + \omega^2 R^2 C^2)}. \qquad \text{EQ. 1}$$

For purposes of calibration, the capacitance measurements are repeated at various dielectric layer thicknesses for the same wafer (i.e., polish, stop and then determine both C and a corresponding optical thickness). A graph of capacitance vs. 1/(optical thickness) is then plotted to determine the relationship between thickness and capacitance (for example, using any suitable known linear regression algorithm). The relationship of measured capacitance to optical thickness may be given by the expression:

$$C_{measured} = C_0 + \alpha \left( \frac{1}{T_{optical}} \right). \qquad \text{EQ. 2}$$

Using the above relationship, as indicated by EQ. 2, the dielectric layer thickness for a particular wafer structure can thereafter be determined, given the measured capacitance, in accordance with the following expression:

$$T_{sensor} = \frac{\alpha}{(C_{measured} - C_0)}, \qquad \text{EQ. 3}$$

wherein $C_{Measured}$ is obtained from the wafer to be measured using the relationship of EQ. 1, and a and $C_0$ are constants determined in a calibration procedure in accordance with the relationship of EQ. 2.

Returning now to FIG. 4, current-to-capacitance converter means 128 preferably includes means for implementing a least-squares fit to the out-of-phase component of the current as a function of applied signal frequency for providing the sensed capacitance C. The current-to-capacitance converter means 128 may be implemented using any suitable programmable device, such as a computer, for receiving appropriate inputs, carrying out the intended function(s), and for providing the desired outputs. For example, an output signal from the current-to-capacitance converter means 128 may be used for sequencing the signal generating means 126 through the various frequencies in the process of obtaining the system capacitance C, as discussed herein above.

The capacitance-to-thickness converter means 122 (FIG. 4) includes means for determining the dielectric thickness as a function of the sensed capacitance. The determination of dielectric thickness is in accordance with the relationship given by $$T_{sensor} = \frac{\alpha}{(C_{measured} - C_0)},$$

wherein $C_{measured}$ is a measured capacitance as sensed by the capacitive sensing means 120, and α and $C_0$ are constants determined in accordance with a calibration procedure with the use of a reference workpiece. The reference workpiece used for the calibration procedure included a similar dielectric layer and given level of BEOL structure as the workpiece under dielectric thickness measurement.

Figure 9:
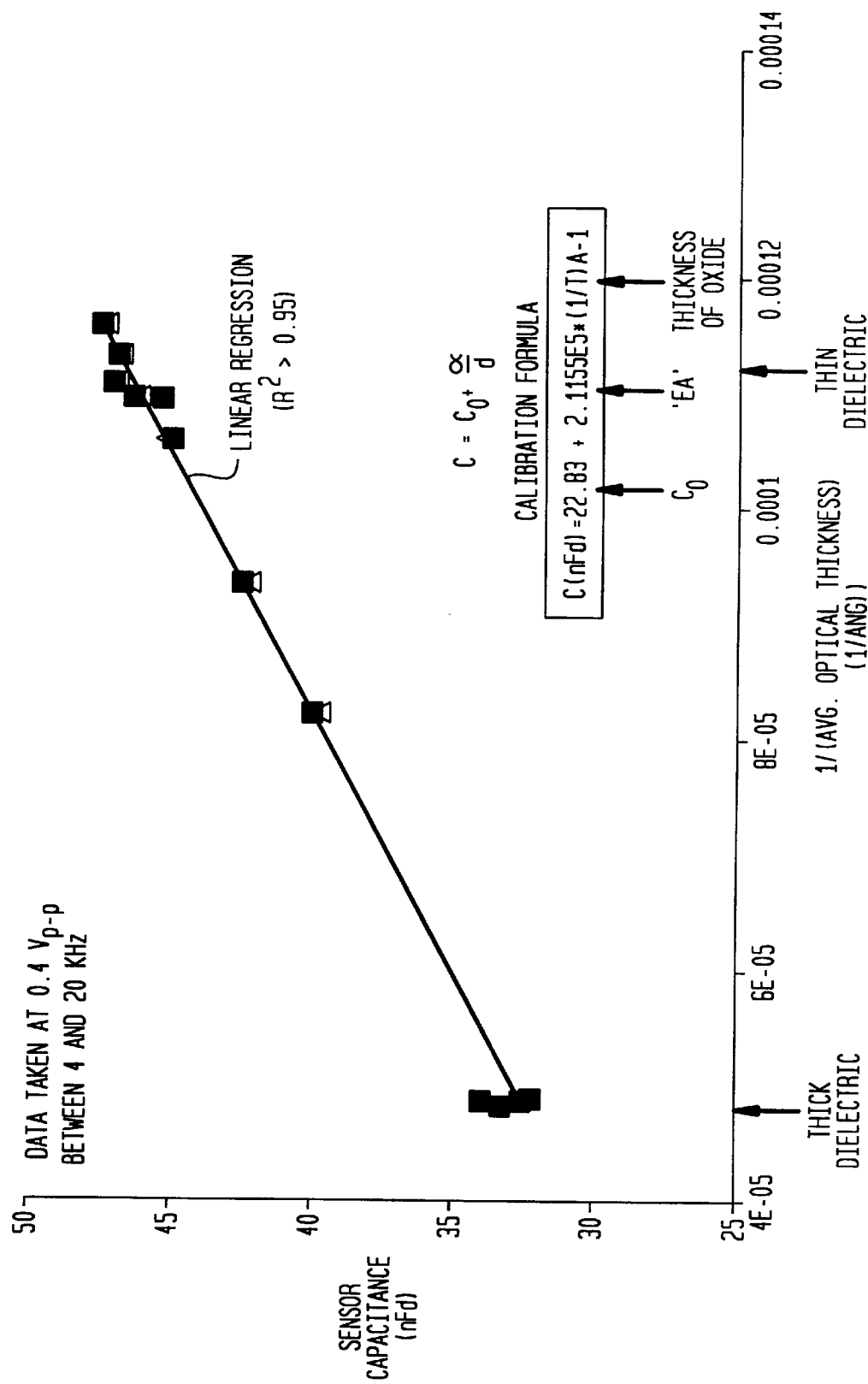
FIG. 9 is illustrative of an exemplary calibration characteristic of a measured system capacitance versus 1/optical thickness in accordance with a calibration characteristic for a particular back-end-of-line VLSI wafer structure in accordance with the present invention.

A calibration means 129, which may form part of the current-to-capacitance converter means 128 and the capacitance-to-thickness converter means 122, is provided for calibrating the capacitance-to-thickness converter means 122. The calibration means 129 includes (I) input means 130 for inputting at least three sets of calibration data obtained with the use of the reference workpiece, wherein each of the at least three sets of calibration data is obtained using the reference workpiece and further in which the reference workpiece dielectric layer has been polished to at least three different thicknesses. The calibration data further includes a sensed capacitance using the reference workpiece, as sensed by the capacitive sensing means 120 and a corresponding independent optically measured thickness of the dielectric layer of the reference workpiece for each of the at least three different reference workpiece dielectric thicknesses. The calibration means 129 further includes (ii) means for determining, from a plot of capacitance vs. 1/(optical thickness) obtained using the calibration data and with a suitable linear regression algorithm, the constants α and $C_0$ in accordance with the relationship between thickness and capacitance as given by:

$$C_{measured} = C_0 + \alpha \left( \frac{1}{T_{optical}} \right),$$

where $C_{measured}$ is the sensed capacitance as measured by the capacitive sensing means 120 and $T_{optical}$ is a corresponding independent optically measured thickness of the dielectric layer of the reference workpiece. FIG. 9 is representative of a plot of sensed capacitance vs. 1/(optical thickness) for a particular BEOL wafer structure. The present technique requires distinct calibration curves for wafers of different technologies and different levels under polish. While the present invention requires separate calibration curves for wafers of different technologies and different levels under polish, the calibration need only be done once for any one particular wafer structure, wherein thereafter, any wafers having similar structures, such as during a manufacturing run, may be measured using the method and apparatus of the present invention and the appropriate calibration information.

In accordance with an alternate embodiment of the present invention, a chemical-mechanical polishing system includes a chemical-mechanical polishing apparatus 50 for polishing of a dielectric layer on a surface of a workpiece in a polishing slurry, wherein the workpiece includes a given level of back-end-of-line (BEOL) structure including junctions. An in-line dielectric thickness measurement apparatus 100, separate from the chemical-mechanical polishing apparatus 50, is provided for measuring an in-line thickness measurement of the dielectric film layer subsequent to a prescribed polishing of the dielectric layer of the workpiece by the chemical-mechanical polishing apparatus 50. The in-line thickness measurement apparatus 100 further provides a thickness measurement output signal. A positioning means is provided for suitably positioning the workpiece between the chemical-mechanical polishing apparatus 50 and the in-line thickness measurement apparatus 100. Lastly, a controller is provided for controlling a polishing sequence of the workpiece by the chemical-mechanical polishing apparatus 50 in response to the thickness measurement output signal provided by the in-line thickness measurement apparatus 100. The in-line thickness measurement apparatus 100 is as described herein above with respect to the corresponding FIGS.

In summary, the present invention provides a method and apparatus for obtaining dielectric thickness from current measurements carried out using an in-line dielectric thickness measurement station 100. A simple RC circuit is used to model the multilayer structure of the dielectric layer and wafer in the measurement system. The present invention provides good measurement stability, for example, a day-to-day stability with a 1 sigma deviation of 0.44 nFd @ 41 nFd has been obtained. Still further, a measurement range of +/−500 Å or better has been obtained relative to other known in-situ dielectric thickness measurement techniques using product wafers submerged in slurry.

The present invention is insensitive to post polish cleaning, since the thickness measurement is performed immediately after a polishing of the wafer and in the same CMP slurry used for polishing, or a identical slurry. The present invention also utilizes a constant low voltage which ensures minimal impact upon the sensitive integrated circuit components of the wafer being measured. The present invention is also less sensitive to within chip thickness variations, since the present invention effectively averages the oxide thickness over a large area of between 3 to 5 inches. The present invention still further utilizes multiple frequencies (giving rise to the phrase multi-frequency technique) in conjunction with the simple RC model to extract thickness, thus providing a high accuracy measurement. Even yet still further, the present invention provides a method and apparatus for oxide thickness measurement which is mechanically simple and relatively inexpensive to implement, with a minimal chance for failure.

There has thus been shown a method and apparatus for in-line dielectric thickness measurement in which the present invention utilizes multi-frequency impedance measurements in conjunction with a simple RC model to extract a capacitance. Using the capacitance measurement and a calibration curve, the oxide thickness is then determined. The present invention thus provides an advantageous solution to the problem of how to implement an in-line thickness metrology for a wet oxide CMP process.

Figure 10:
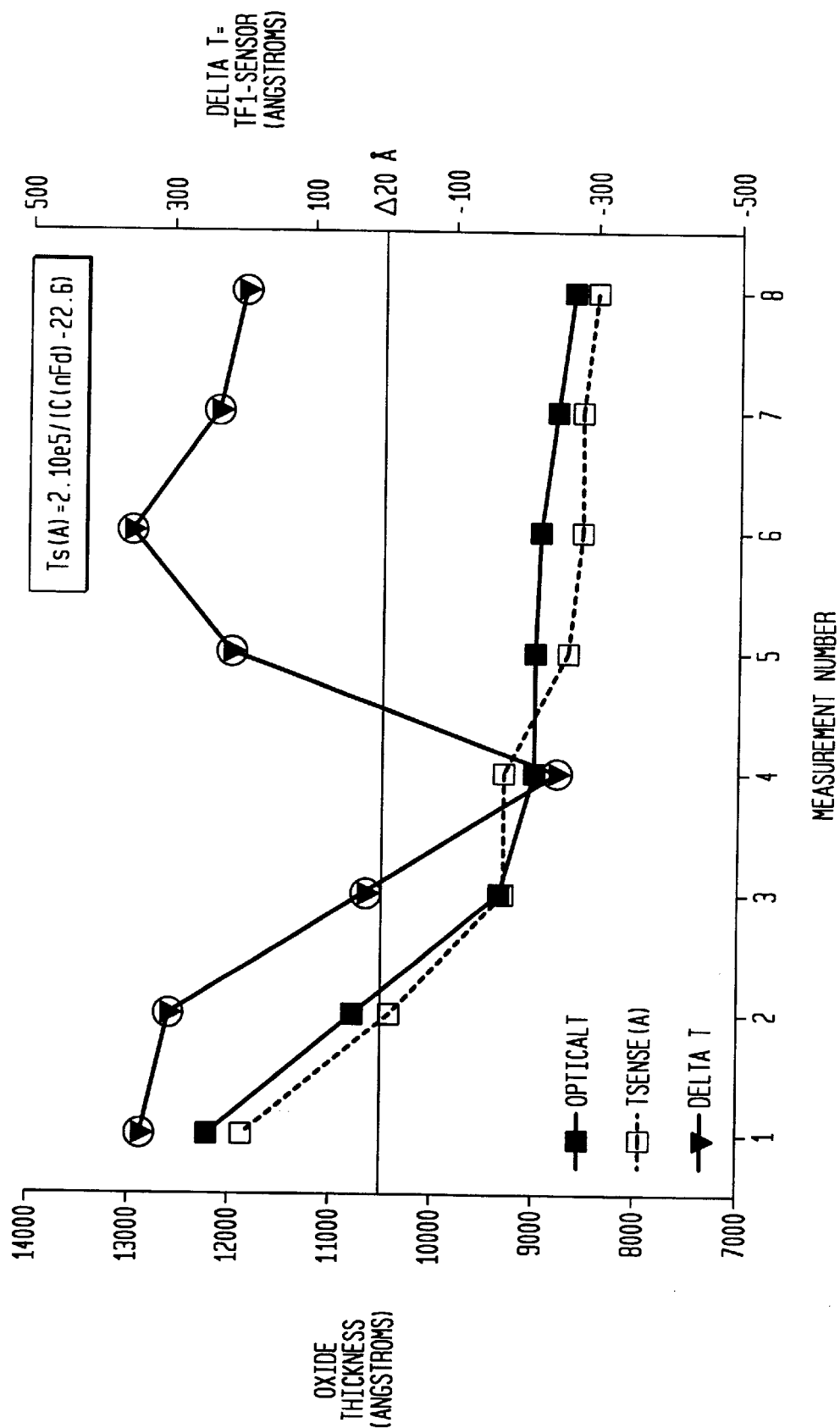
FIG. 10 is a plot of thickness measurements obtained using the method and apparatus of the present invention in comparison with optical thickness measurements for illustrating an accuracy of the present invention.

The in-line method and apparatus of the present invention has accuracy on the order of +/−500 Å. Turning now to FIG. 10, FIG. 10 illustrates an accuracy of the present invention. In particular, eight (8) thickness comparison measurements were conducted on a single wafer having a certain BEOL structure level at different stages during a polishing operation. FIG. 10 contains a plot of oxide thicknesses for each of the eight comparison measurements as noted by the axis label on the left-hand side of the plot (i.e., "Oxide Thickness (Angstroms)"). For each measurement number, an optical thickness and a thickness measurement as measured by the method and apparatus of the present invention were obtained and plotted. Referring now to the right-hand axis (i.e, labeled "Delta T=TF1-Sensor (Angstroms)"), delta thickness (Delta T) corresponds to a difference between the optically measured oxide thickness as measured using a Tencor model TF-1 optical thickness measurement apparatus and the oxide thickness as measured by the method and apparatus of the present invention for each of the measurement numbers as shown. The Tencor model TF-1 is commercially available from Tencor Instruments of Mountain View, Calif.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention. For example, a more complex model of the RC equivalent circuit model may be used in conjunction with the current-to-capacitance converter means. similarly, other changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. An apparatus for in-line thickness measurement of a dielectric film layer on a surface of a workpiece subsequent to a polishing of the dielectric film layer on a chemical-mechanical polishing machine in a polishing slurry, the workpiece having a given level of back-end-of-line (BEOL) structure including junctions, said apparatus comprising:

a measurement platen;

a measurement electrode embedded within said measurement platen;

means for positioning the workpiece above said measurement electrode with the dielectric layer facing in a direction of said measurement electrode;

means for maintaining a prescribed level of a conductive polishing slurry above said measurement electrode, the prescribed level to ensure a desired slurry coverage of the workpiece, wherein the slurry maintains a static electrical contact with the dielectric layer and the workpiece;

means for sensing a system capacitance C in accordance with an RC equivalent circuit model in which a resistance R is representative of the slurry and workpiece resistances and the system capacitance C is representative of the dielectric material and junction capacitances; and means for converting the sensed capacitance to a dielectric thickness in accordance with a prescribed system capacitance/optical thickness calibration, wherein the prescribed calibration corresponds to the given level of BEOL structure of the workpiece.

2. The apparatus of claim 1, wherein said measurement electrode includes a circular center electrode and a circular ring guard electrode surrounding and concentric with the center electrode, the center electrode and the guard electrode being electrically isolated from each other and from said measurement platen.

3. The apparatus of claim 1, wherein said capacitance sensing means includes (I) means for sensing an out-of-phase component of an alternating current flowing through the system at various preselected frequencies and constant applied voltage, (ii) a variable frequency alternating current source for providing the constant applied voltage at the various preselected frequencies, and (iii) current-to-capacitance converter means for converting the sensed out-of-phase component of the AC current at the various frequencies into a system capacitance in accordance with the RC equivalent circuit model.

4. The apparatus of claim 3, further wherein the various preselected frequencies include frequencies in the range of 1 to 50 kHz and the constant applied voltage includes a voltage of less than 0.5 volts.

5. The apparatus of claim 3, further wherein the current-to-capacitance converter means includes means for implementing a least-squares fit to the out-of-phase component of the current as a function of applied signal frequency for providing the sensed capacitance C.

6. The apparatus of claim 1, wherein
said capacitance-to-thickness converter means includes means for determining the dielectric thickness as a function of the sensed capacitance in accordance with the relationship given by $$T_{sensor} = \frac{\alpha}{(C_{measured} - C_0)},$$

wherein $C_{measured}$ is a measured capacitance as sensed by said capacitive sensing means, and $\alpha$ and $C_0$ are constants determined in accordance with a calibration procedure with the use of a reference workpiece, the reference workpiece having a similar dielectric layer and given level of BEOL structure as the workpiece under dielectric thickness measurement.

7. The apparatus of claim 6, further comprising
means for calibrating said capacitance-to-thickness converter means, wherein said calibration means includes (I) input means for inputting at least three sets of calibration data obtained with the use of the reference workpiece, wherein each of the at least three sets of calibration data is obtained using the reference workpiece and further in which the reference workpiece dielectric layer has been polished to at least three different thicknesses, the calibration data including a sensed capacitance ($C_{measured}$) using the reference workpiece as sensed by said capacitive sensing means and a corresponding independent optically measured thickness ($T_{optical}$) of the dielectric layer of the reference workpiece for each of the at least three different reference workpiece dielectric thicknesses, and (ii) means for determining, from a plot of capacitance vs. 1/(optical thickness) obtained using the calibration data and with a suitable linear regression algorithm, the constants $\alpha$ and $C_0$ in accordance with the relationship between thickness and capacitance as given by $$C_{measured} = C_0 + \alpha\left(\frac{1}{T_{optical}}\right).$$

8. A chemical-mechanical polishing system comprising:
means for chemical-mechanical polishing of a dielectric layer on a surface of a workpiece in a polishing slurry, the workpiece having a given level of back-end-of-line (BEOL) structure including junctions;

means, separate from said chemical-mechanical polishing means, for measuring an in-line thickness measurement of the dielectric film layer subsequent to a prescribed polishing of the dielectric layer of the workpiece by said chemical-mechanical polishing means, said in-line thickness measurement means providing a thickness measurement output signal;

means for positioning the workpiece between the chemical-mechanical polishing means and said in-line thickness measurement means; and means for controlling a polishing sequence of the workpiece by said chemical-mechanical polishing means in response to the thickness measurement output signal, wherein said in-line thickness measurement means further includes a measurement platen;

a measurement electrode embedded within said measurement platen, wherein said positioning means is further for positioning the workpiece above said measurement electrode with the dielectric layer facing in a direction of said measurement electrode;

means for maintaining a prescribed level of the polishing slurry above said measurement electrode, the prescribed level to ensure a desired slurry coverage of the workpiece, wherein the polishing slurry further maintains a static electrical contact with the dielectric layer and the workpiece;

means for sensing a system capacitance C in accordance with an RC equivalent circuit model in which a resistance R is representative of the slurry and workpiece resistances and the system capacitance C is representative of the dielectric material and junction capacitances; and means for converting the sensed capacitance to a dielectric thickness in accordance with a prescribed system capacitance/optical thickness calibration, wherein the prescribed calibration corresponds to the given level of BEOL structure of the workpiece.

9. The apparatus of claim 8, wherein
said measurement electrode includes a circular center electrode and a circular ring guard electrode surrounding and concentric with the center electrode, the center electrode and the guard electrode being electrically isolated from each other and from said measurement platen.

10. The apparatus of claim 8, wherein
said capacitance sensing means includes (I) means for sensing an out-of-phase component of an alternating current flowing through the system at various preselected frequencies and constant applied voltage, (ii) a variable frequency alternating current source for providing the constant applied voltage at the various preselected frequencies, and (iii) current-to-capacitance converter means for converting the sensed out-of-phase component of the AC current at the various frequencies into a system capacitance in accordance with the RC equivalent circuit model.

11. The apparatus of claim 10, further wherein
the various preselected frequencies include frequencies in the range of 1 to 50 kHz and the constant applied voltage includes a voltage of less than 0.5 volts.

12. The apparatus of claim 10, further wherein
the current-to-capacitance converter means includes means for implementing a least-squares fit to the out-of-phase component of the current as a function of applied signal frequency for providing the sensed capacitance C.

13. The apparatus of claim 8, wherein
said capacitance-to-thickness converter means includes means for determining the dielectric thickness as a function of the sensed capacitance in accordance with the relationship given by $$T_{sensor} = \frac{\alpha}{(C_{measured} - C_0)},$$

wherein $C_{measured}$ is a measured capacitance as sensed by said capacitive sensing means, and $\alpha$ and $C_0$ are constants determined in accordance with a calibration procedure with the use of a reference workpiece, the reference workpiece having a similar dielectric layer and given level of BEOL structure as the workpiece under dielectric thickness measurement.

14. The apparatus of claim 13, further comprising means for calibrating said capacitance-to-thickness converter means, wherein said calibration means includes (I) input means for inputting at least three sets of calibration data obtained with the use of the reference workpiece, wherein each of the at least three sets of calibration data is obtained using the reference workpiece and further in which the reference workpiece dielectric layer has been polished to at least three different thicknesses, the calibration data including a sensed capacitance ($C_{measured}$) using the reference workpiece as sensed by said capacitive sensing means and a corresponding independent optically measured thickness ($T_{optical}$) of the dielectric layer of the reference workpiece for each of the at least three different reference workpiece dielectric thicknesses, and (ii) means for determining, from a plot of capacitance vs. 1/(optical thickness) obtained using the calibration data and with a suitable linear regression algorithm, the constants $\alpha$ and $C_0$ in accordance with the relationship between thickness and capacitance as given by $$C_{measured} = C_0 + \alpha \left( \frac{1}{T_{optical}} \right).$$

15. An method for in-line thickness measurement of a dielectric film layer on a surface of a workpiece subsequent to a polishing of the dielectric film layer on a chemical-mechanical polishing machine in a polishing slurry, the workpiece having a given level of back-end-of-line (BEOL) structure including junctions, said method comprising the steps of:
   providing a measurement platen;
   providing a measurement electrode embedded within the measurement platen;
   positioning the workpiece above the measurement electrode with the dielectric layer facing in a direction of the measurement electrode;
   maintaining a prescribed level of the polishing slurry above the measurement electrode, the prescribed level to ensure a desired slurry coverage of the workpiece, wherein the slurry maintains a static electrical contact with the dielectric layer and the workpiece;
   sensing a system capacitance C in accordance with an RC equivalent circuit model in which a resistance R is representative of the slurry and workpiece resistances and the system capacitance C is representative of the dielectric material and junction capacitances; and
   converting the sensed capacitance to a dielectric thickness in accordance with a prescribed system capacitance/optical thickness calibration, wherein the prescribed calibration corresponds to the given level of BEOL structure of the workpiece.

16. The method of claim 15, wherein
the measurement electrode includes a circular center electrode and a circular ring guard electrode surrounding and concentric with the center electrode, the center electrode and the guard electrode being electrically isolated from each other and from the measurement platen.

17. The method of claim 15, wherein
the step of sensing the capacitance includes (I) sensing an out-of-phase component of an alternating current flowing through the system at various preselected frequencies and constant applied voltage, (ii) using a variable frequency alternating current source for providing the constant applied voltage at the various preselected frequencies, and (iii) converting the sensed out-of-phase component of the AC current at the various frequencies into a system capacitance in accordance with the RC equivalent circuit model.

18. The method of claim 17, further wherein
the various preselected frequencies include frequencies in the range of 1 to 50 kHz and the constant applied voltage includes a voltage of less than 0.5 volts.

19. The method of claim 17, further wherein
said current-to-capacitance converting step further includes implementing a least-squares fit to the out-of-phase component of the current as a function of applied signal frequency for providing the sensed capacitance C.

20. The method of claim 15, wherein
said capacitance-to-thickness converting step further includes determining the dielectric thickness as a function of the sensed capacitance in accordance with the relationship given by $$T_{sensor} = \frac{\alpha}{(C_{measured} - C_0)},$$

wherein $C_{measured}$ is a measured capacitance as sensed by said capacitive sensing step, and $\alpha$ and $C_0$ are constants determined in accordance with a calibration procedure with the use of a reference workpiece, the reference workpiece having a similar dielectric layer and given level of BEOL structure as the workpiece under dielectric thickness measurement.

21. The method of claim 20, further comprising the step of:
   calibrating said capacitance-to-thickness converting step, wherein said calibration step includes (I) inputting at least three sets of calibration data obtained with the use of the reference workpiece, wherein each of the at least three sets of calibration data is obtained using the reference workpiece and further in which the reference workpiece dielectric layer has been polished to at least three different thicknesses, the calibration data including a sensed capacitance ($C_{measured}$) using the reference workpiece as sensed by said capacitive sensing step and a corresponding independent optically measured thickness ($T_{optical}$) of the dielectric layer of the reference workpiece for each of the at least three different reference workpiece dielectric thicknesses, and (ii) determining, from a plot of capacitance vs. 1/(optical thickness) obtained using the calibration data and with a suitable linear regression algorithm, the constants $\alpha$ and $C_0$ in accordance with the relationship between thickness and capacitance as given by $$C_{measured} = C_0 + \alpha\left(\frac{1}{T_{optical}}\right).$$

22. A method for chemical-mechanical polishing comprising the steps of:

chemical-mechanical polishing a dielectric layer on a surface of a workpiece in a polishing slurry, the workpiece having a given level of back-end-of-line (BEOL) structure including junctions;

measuring an in-line thickness of the dielectric film layer subsequent to a prescribed polishing of the dielectric layer of the workpiece by said chemical-mechanical polishing step, said in-line thickness measurement step providing a thickness measurement output signal;

positioning the workpiece as appropriate for polishing during said chemical-mechanical polishing step and for thickness measurement during said in-line thickness measurement step; and controlling a polishing sequence of the workpiece by said chemical-mechanical polishing step in response to the thickness measurement output signal, wherein said in-line thickness measurement step includes the steps of providing a measurement platen;

providing a measurement electrode embedded within the measurement platen;

positioning the workpiece above the measurement electrode with the dielectric layer facing in a direction of the measurement electrode;

maintaining a prescribed level of the polishing slurry above the measurement electrode, the prescribed level to ensure a desired slurry coverage of the workpiece, wherein the slurry maintains a static electrical contact with the dielectric layer and the workpiece;

sensing a system capacitance C in accordance with an RC equivalent circuit model in which a resistance R is representative of the slurry and workpiece resistances and the system capacitance C is representative of the dielectric material and junction capacitances; and converting the sensed capacitance to a dielectric thickness in accordance with a prescribed system capacitance/ optical thickness calibration, wherein the prescribed calibration corresponds to the given level of BEOL structure of the workpiece.

* * * * *